United States Patent [19]
Pozdeev et al.

[11] Patent Number: 6,115,594
[45] Date of Patent: Sep. 5, 2000

[54] FREQUENCY CONVERTER USED IN A MICROWAVE SYSTEM

[75] Inventors: Oleg Pozdeev; Doo-Hun Choi, both of Seoul; Soon-Chul Jeong, Kyonggi-do, all of Rep. of Korea

[73] Assignee: SamSung Electronics Co., Ltd., Suwon, Rep. of Korea

[21] Appl. No.: 09/083,506

[22] Filed: May 22, 1998

[30]         Foreign Application Priority Data

Jun. 11, 1997  [KR]   Rep. of Korea ...................... 97-24037

[51] Int. Cl.⁷ ...................................................... H04B 1/26
[52] U.S. Cl. .......................... 455/326; 455/327; 455/323
[58] Field of Search ................................... 455/326, 327, 455/232, 330, 319; 333/26, 121

[56]                References Cited

U.S. PATENT DOCUMENTS

| | | |
|---|---|---|
| 3,512,090 | 5/1970 | Mouw ...................................... 455/326 |
| 3,659,206 | 4/1972 | Hallford . |
| 3,772,599 | 11/1973 | Ernst et al. . |
| 3,803,519 | 4/1974 | Ohi et al. . |
| 3,818,385 | 6/1974 | Mouw . |
| 3,886,500 | 5/1975 | Baril et al. ............................... 333/121 |
| 3,939,429 | 2/1976 | Löhn et al. . |
| 3,946,339 | 3/1976 | Oltman, Jr. et al. ....................... 333/11 |
| 4,063,176 | 12/1977 | Milligan et al. . |
| 4,099,126 | 7/1978 | Hallford . |
| 4,193,048 | 3/1980 | Nyhus ....................................... 333/26 |
| 4,377,005 | 3/1983 | Marchand et al. . |
| 4,380,830 | 4/1983 | Marchand et al. . |
| 4,392,250 | 7/1983 | Hallford ................................. 455/327 |
| 4,392,251 | 7/1983 | Hallford ................................. 455/327 |
| 4,420,839 | 12/1983 | Hogerheiden, Jr. . |
| 4,498,061 | 2/1985 | Mörz et al. . |
| 4,509,209 | 4/1985 | Itoh et al. . |
| 4,603,436 | 7/1986 | Butler ...................................... 455/319 |
| 4,636,755 | 1/1987 | Gibbs . |
| 4,661,997 | 4/1987 | Roberts et al. ......................... 455/327 |
| 4,755,775 | 7/1988 | Marczewski et al. . |
| 4,777,458 | 10/1988 | Pardini . |
| 4,823,400 | 4/1989 | Dobrovolny . |
| 4,876,239 | 10/1989 | Cachier ....................................... 505/1 |
| 4,876,744 | 10/1989 | Endo et al. ............................. 455/326 |
| 4,882,553 | 11/1989 | Davis et al. .............................. 333/26 |
| 4,980,925 | 12/1990 | Blustine et al. . |
| 5,361,050 | 11/1994 | Einbinder . |
| 5,412,354 | 5/1995 | Quan . |
| 5,428,838 | 6/1995 | Chang et al. ........................... 455/326 |
| 5,428,840 | 6/1995 | Sadhir . |
| 5,698,469 | 12/1997 | Mohwinkel et al. .................... 437/205 |
| 5,978,666 | 11/1999 | Faulkner et al. ........................ 455/327 |
| 5,983,089 | 11/1999 | Mohwinkel et al. .................... 455/323 |

*Primary Examiner*—Dwayne D. Bost
*Assistant Examiner*—Joy K. Redmon
*Attorney, Agent, or Firm*—Robert E. Bushnell, Esq.

[57]                ABSTRACT

A frequency converter for a microwave system includes: a balun having a slot line connected in a parallel T-junction with a first microstrip line for receiving a radio frequency signal; first and second strip lines respectively disposed on either side of the first microstrip line; second and third microstrip lines respectively connected to outer ends of the first and second strip lines to provide signal paths for inputting local oscillation signals and for outputting intermediate frequency signals; first and second open end circuits respectively connected to both ends of the slot line, and a quad diode mixer bridge having a pair of diode connection points connected to the slot line and having another pair of diode connection points respectively connected to the second and third microstrip lines, the radio frequency signal and local oscillation signals being converted into corresponding intermediate signals therein.

30 Claims, 7 Drawing Sheets

FREQUENCY CONVERTER USED IN A MICROWAVE SYSTEM

CLAIM OF PRIORITY

This application makes reference to, incorporates the same herein, and claims all benefits accruing under 35 U.S.C. §119 from an application for FREQUENCY CONVERTER USED IN A MICROWAVE SYSTEM earlier filed in the Korean Industrial Property Office on Jun. 11, 1997 and there duly assigned Serial No. 24037/1997.

BACKGROUND OF THE INVENTION

1. Field of the Invention

The present invention concerns a frequency converter used in a microwave system, and more particularly the circuit layout structure of a frequency converter for supplying the ports for a quad diode mixer bridge.

2. Description of the Related Art

It is essential for a microwave system or radar system to include a frequency converter or mixer for converting an intermediate frequency (IF) signal into a radio frequency signal or vice versa. Such a frequency converter typically comprises diodes and a microstrip circuit layout for supplying the ports to the diodes.

In a prior art microwave mixer employing a balanced to unbalanced line converter (hereinafter referred to as a "balun") composed of microstrip lines and a slot line, two local oscillation signals with a phase difference of 90° are supplied in an unbalanced form through the microstrip lines to a quad diode mixer bridge. The RF signal is supplied in a balanced form through another microstrip line to the quad diode mixer bridge. As the distance between the diodes arranged in the quad diode mixer bridge approaches zero, the variation of the image impedance becomes less so as to reduce the conversion loss due to the frequency variation. In addition, the transmission path for passing the signal from the frequency converter is orthogonal to prevent unwanted coupling.

However, such a frequency converter has an allowable frequency band which is limited to about one octave according to the frequency characteristics of a λ/4 open strip line a λ/4 short-circuited slot line. More specifically, assuming the frequency converter has a central frequency fo, the slot line is short-circuited at 2fo giving infinite admittance while the open strip line gives infinite impedance, so that the two local oscillation signals may not be supplied to the quad diode mixer bridge.

The following patents each disclose features in common with the present invention but do not teach or suggest the specifically recited frequency converter of the present invention: U.S. Pat. No. 5,428,840 to Sadhir, entitled Monolithic Double Balanced Microstrip Mixer With Flat Conversion Loss, U.S. Pat. No. 5,412,354 to Quan, entitled Single Layer Double Ring Hybrid Magic-Tee, U.S. Pat. No. 5,361,050 to Einbinder, entitled Balanced Split Ring Resonator, U.S. Pat. No. 4,980,925 to Blustine et al., entitled Monopulse First Detector Array, U.S. Pat. No. 4,876,744 to Endo et al., entitled Mixer With Rat Race Circuit, U.S. Pat. No. 4,823,400 to Dobrovolny, entitled Radio Frequency Mixer, U.S. Pat. No. 4,777,458 to Pardini, entitled Thin Film Power Coupler, U.S. Pat. No. 4,755,775 to Marczewski et al., entitled Microwave Balun For Mixers And Modulators, U.S. Pat. No. 4,636,755 to Gibbs, entitled High-Ratio, Isolated Microwave Branch Coupler With Power Divider, Phase Shifters, And Quadrature Hybrid, U.S. Pat. No. 4,509,209 to Itoh et al., entitled Quasi-Optical Polarization Duplexed Balanced Mixer, U.S. Pat. No. 4,498,061 to Mörz et al., entitled Microwave Receiving Device, U.S. Pat. No. 4,420,839 to Hogerheiden Jr., entitled Hybrid Ring Having Improved Bandwidth Characteristic, U.S. Pat. No. 4,392,251 to Hallford, entitled Symmetric Microwave Mixer With Coplanar Diode Connection, U.S. Pat. No. 4,380,830 to Marchand et al., entitled Microwave Up-converter, U.S. Pat. No. 4,377,005 to Marchand et al., entitled Ultra-High Frequency Hybrid Mixer, U.S. Pat. No. 4,193,048 to Nyhus, entitled Balun Transformer, U.S. Pat. No. 4,099,126 to Hallford, entitled Frequency Converter Apparatus, U.S. Pat. No. 4,063,176 to Milligan et al., entitled Broadband High Frequency Mixer, U.S. Pat. No. 3,939,429 to Löhn et al., entitled Tunable High Frequency Input Circuit For A Television Receiver That Tunes Both VHF And UHF Channels And Can Be Readily Integrated, U.S. Pat. No. 3,818,385 to Mouw, entitled Hybrid Junction And Mixer Or Modulator, U.S. Pat. No. 3,803,519 to Ohi et al., entitled Wideband Directional Filter Device, U.S. Pat. No. 3,772,599 to Ernst et al., entitled Microwave Double Balanced Mixer, U.S. Pat. No. 3,659,206 to Hallford, entitled Microwave Balanced Mixer Circuit.

SUMMARY OF THE INVENTION

It is an object of the present invention to provide means for enlarging the allowable frequency band of a frequency converter used in a microwave system.

It is another object of the present invention to provide means for minimizing the frequency-dependent impedance variations of the ports of a frequency converter used in a microwave system.

It is a further object of the present invention to reduce the conversion errors owing to the process for fabricating the substrate of a frequency converter used in a microwave system.

According to the present invention, a frequency converter for a microwave system comprises balun having a slot line connected in a parallel T-junction with a first microstrip line for receiving a radio frequency signal, a first and a second strip line respectively arranged at both sides of the first microstrip line, a second and a third microstrip line respectively connected to the outer ends of the first and second strip lines to provide signal paths for inputting local oscillation signals and for outputting intermediate frequency signals, first and second open end circuits respectively connected to both ends of the slot line, and a quad diode mixer bridge having a pair of diode connection points connected to the slot line and having another pair of diode connection points respectively connected to the second and third microstrip lines, whereby the radio frequency signal and local oscillation signals are converted into corresponding intermediate signals.

The present invention will now be described with reference to the drawings attached only by way of example, where same functional elements are represented by same reference numerals for convenience's sake.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE PREFERRED EMBODIMENT

Figure 1:
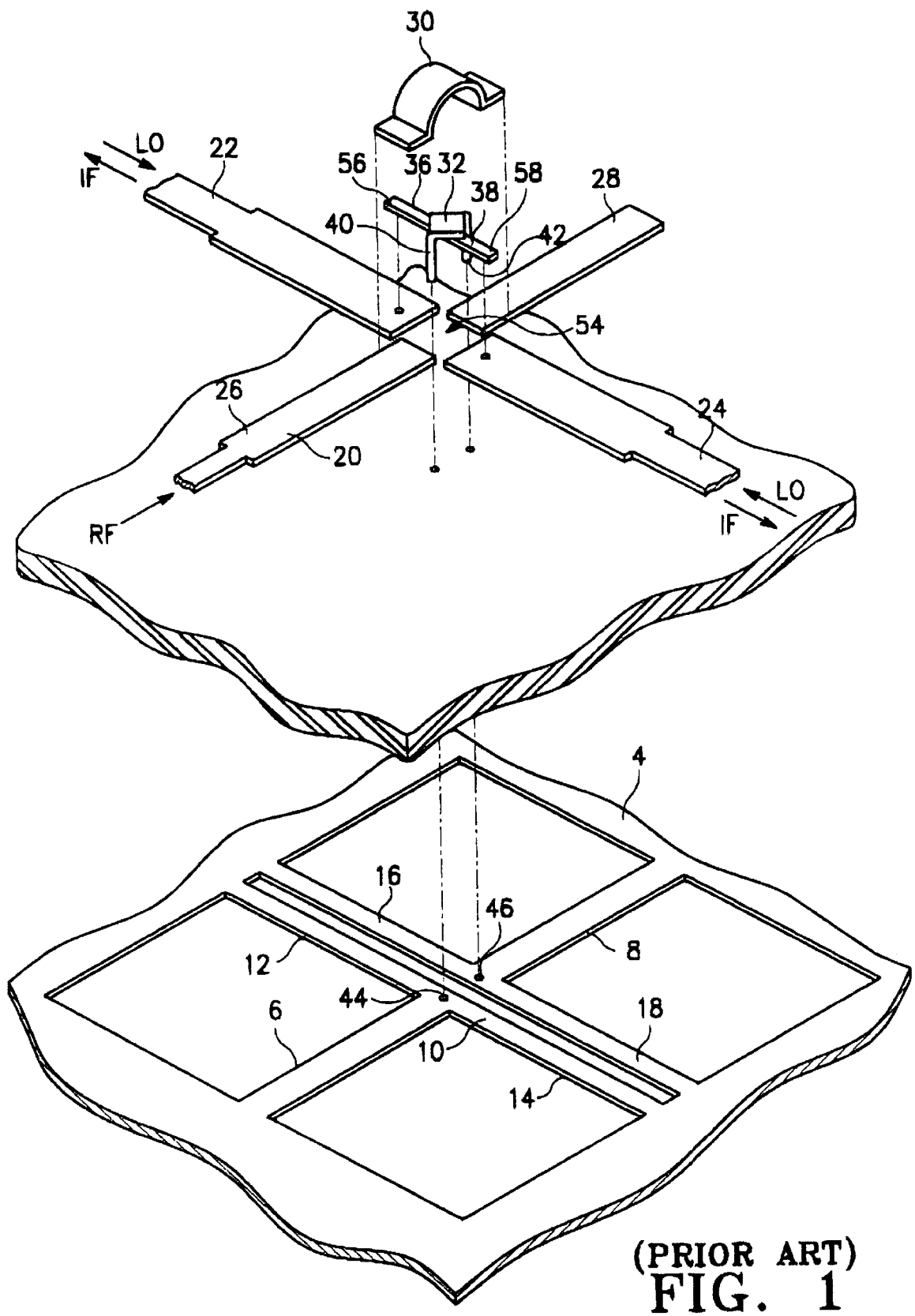
FIG. 1 is a perspective view for illustrating a prior art microwave mixer used in a microwave system.

FIG. 1 illustrates a prior art microwave mixer employing a balanced to unbalanced line converter (hereinafter referred to as a "balun") composed of microstrip lines and a slot line, which is disclosed in U.S. Pat. No. 4,392,250, issued on Jul. 5, 1983, and entitled "Symmetric Microwave Mixer". In this case, two local oscillation signals LO and RF with a phase difference of 90° are supplied in an unbalanced form through the microstrip lines 22 and 24 to a quad diode mixer bridge 32. The RF signal is supplied in a balanced form through the microstrip line 26 to the quad diode mixer bridge 32. As the distance between the diodes arranged in the quad diode mixer bridge 32 approaches zero, the variation of the image impedance becomes less so as to reduce the conversion loss due to the frequency variation. In addition, the transmission path for passing the signal from the frequency converter is orthogonal to prevent unwanted coupling.

However, such a frequency converter has an allowable frequency band which is limited to about one octave according to the frequency characteristics of the $\lambda/4$ open strip line 28 and the $\lambda/4$ short-circuited slot line composed of the strips 12, 16, 14, 18. More specifically, assuming the frequency converter has a central frequency fo, the slot line is short-circuited at 2fo giving infinite admittance while the open strip line gives infinite impedance, so that the signals LO and RF may not be supplied to the quad diode mixer bridge 32.

Figure 2:
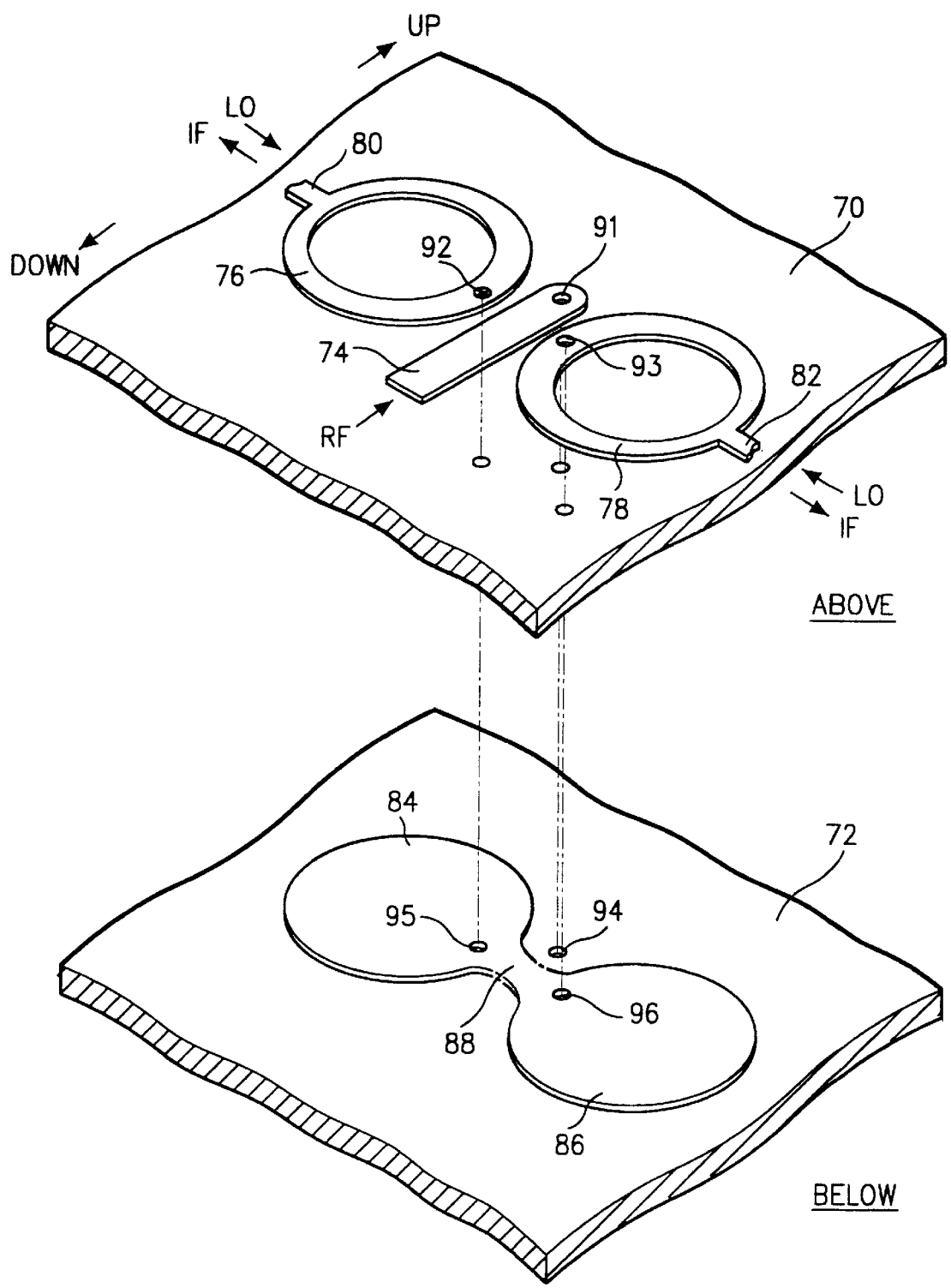
FIG. 2 is a perspective view for illustrating the inventive frequency converter used in a microwave system.
Figure 3A:
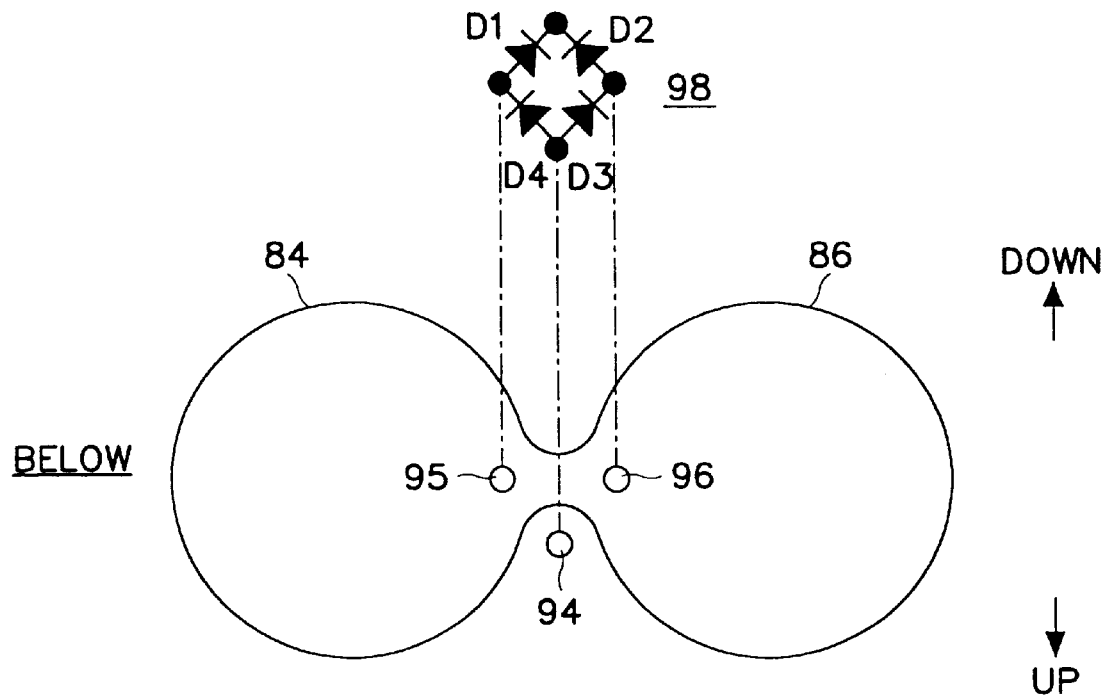
FIGS. 3A and 3B are schematic diagrams for illustrating the view from the lower layer of the frequency converter as shown in FIG. 2.

Referring to FIG. 2, the frequency converter is made of a substrate consisting of an upper ground panel 70 and a lower dielectric layer 72. The upper ground panel 70 has a microstrip line 74, two split strip lines 76 and 78, and two further microstrip lines 80 and 82 mounted thereon. The microstrip line 74 is arranged in the center of the ground panel 70, receiving the RF signal. The strip lines 76 and 78 are arranged respectively and separately at both sides of the microstrip line 74, each being ring shaped. The strip lines 76 and 78 respectively have their ends connected to the microstrip lines 80 and 82 to receive the LO signal and send the IF signal. The microstrip lines 74, 80 and 82 and strip lines 76 and 78 are made of a dielectric layer such as Teflon. The lower dielectric layer 72 has a pair of ring resonators 84 and 86 and a slot line 88 mounted thereon. In addition, three holes 91 to 93 are formed in the upper panel 70 and corresponding holes 94 to 96 are formed in the lower layer 72. These holes are to connect the quad diode mixer bridge 98 composed of four diodes D1–D4 to the microstrip lines, strip lines and ring resonators, as shown in FIG. 3A. Referring to FIG. 3A, the quad diode mixer bridge 98 is connected to the ring resonators so that the hole 94 is used to connect the forward terminals of the diodes D3 and D4, the hole 95 is used to connect the backward terminal of the diode D4 and the forward terminal of the diode D1, and the hole 96 is used to connect the backward terminal of the diode D3 and the forward terminal of the diode D2. These diodes constituting the quad diode mixer bridge 98 serve to generate the IF signal by means of the frequency difference between the RF and the LO signal. It is well-known in this art that such a quad diode mixer bridge serves as a frequency converter.

Figure 3B:
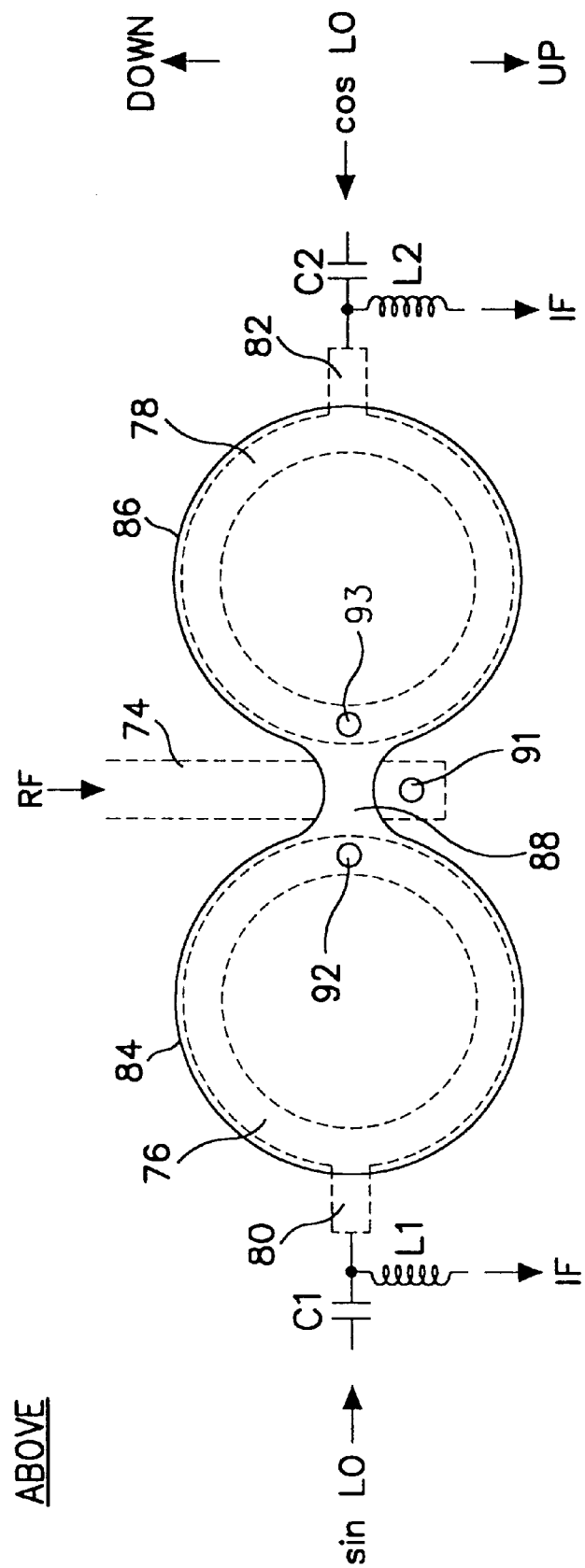

FIG. 3B shows the ring resonators 84 and 86 and slot line 88 built in the lower dielectric layer and the microstrip lines 74, 80 and 82 and the strip lines 76 and 78 in dotted lines in the upper ground panel. The RF signal is supplied through the microstrip line 74 while the local signals sin LO and cos LO are respectively supplied through capacitors C1 and C2 to the microstrip lines 80 and 82. The IF signals are also outputted through the microstrip lines 80 and 82 to inductors L1 and L2. Namely, the input path of the local oscillation signal is the same as the output path of the IF signal.

The characteristics of the inventive frequency converter are summarized as follows:

Firstly, instead of the $\lambda/4$ short-circuited slot line, the slot line 88, having zero length to end the frequency independent open circuit by means of the ring resonators 84 and 86, whose internal regions are removed is used. To use such a slot line 88 is to achieve a broader frequency band, which will be described more specifically in reference to FIG. 4. In addition, the removal of the internal regions of the ring resonators 84 and 86 is to prevent power dispersion.

Secondly, the two separate strip lines 76 and 78 have their ends connected to the microstrip lines 80 and 82, instead of to the conventional strip lines.

Figure 4:
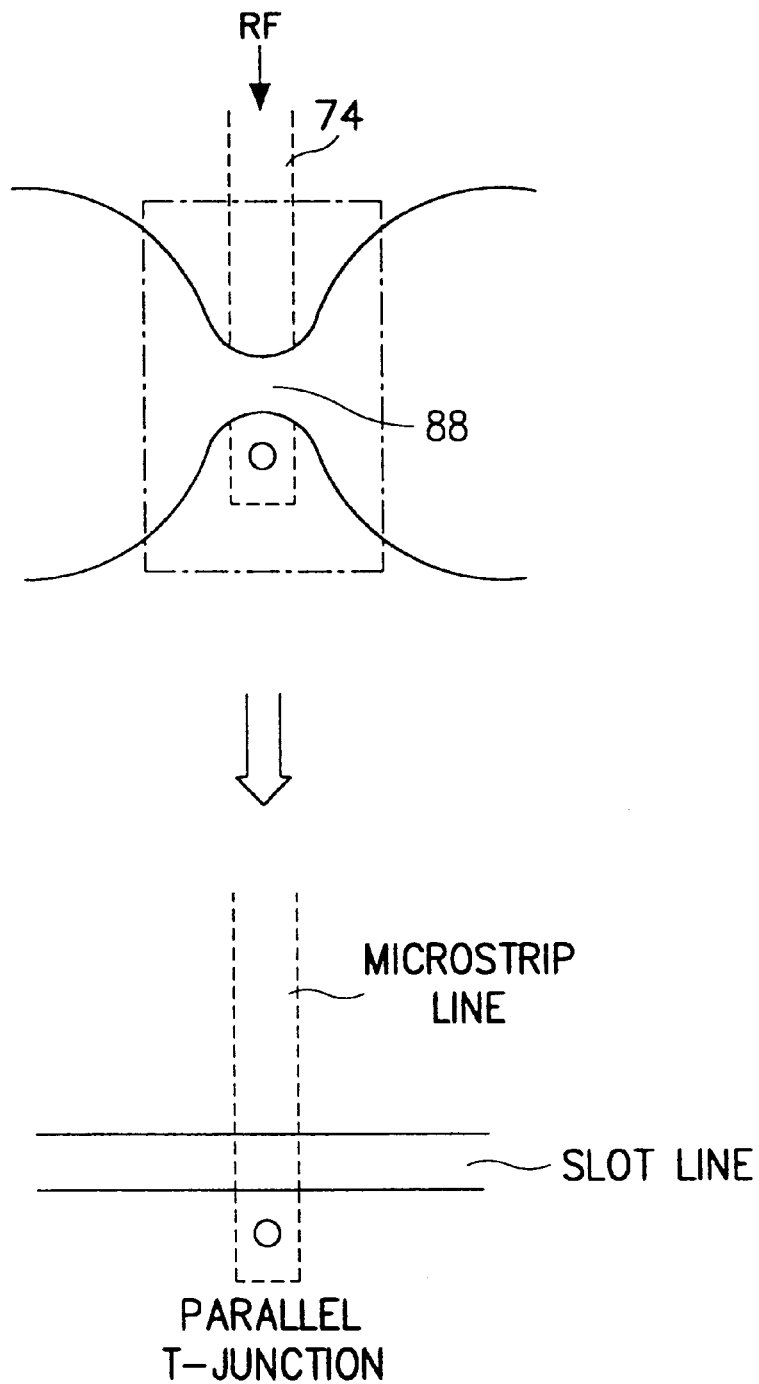
FIG. 4 is a schematic diagram for illustrating the principle applied to embody the inventive frequency converter.

Referring to FIG. 4, the slot line 88 constitutes a parallel T-junction balun along with the microstrip line 74, compared to the conventional $\lambda/4$ short-circuited slot line which constitutes a serial T-junction along with the microstrip line. The slot line 88 has the ends connected to the frequency independent circuits of the ring resonators 84 and 86. This achieves a broader frequency band, which is based on the theory disclosed in Microstrip Lines and Striplines authored by K. C. Gupta, Ramesh Garg et al., 2nd Ed. pp. 306–315.

Figure 5A:
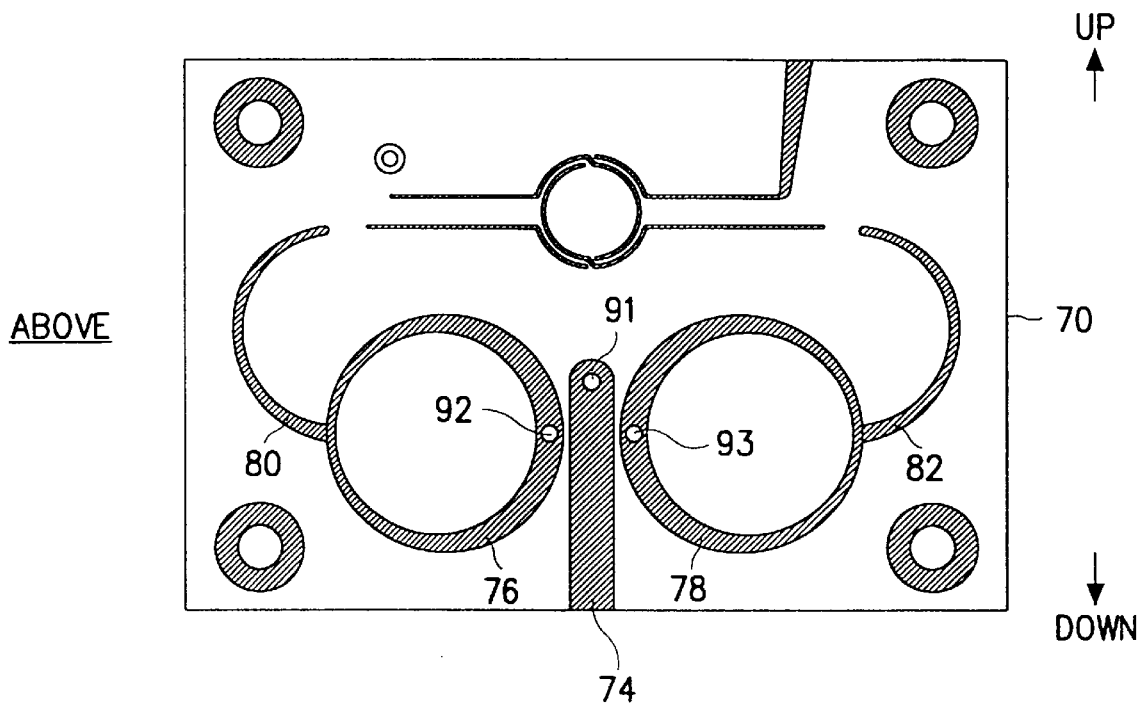
FIGS. 5A and 5B are plane views for illustrating the fabrication of the inventive frequency converter.
Figure 5B:
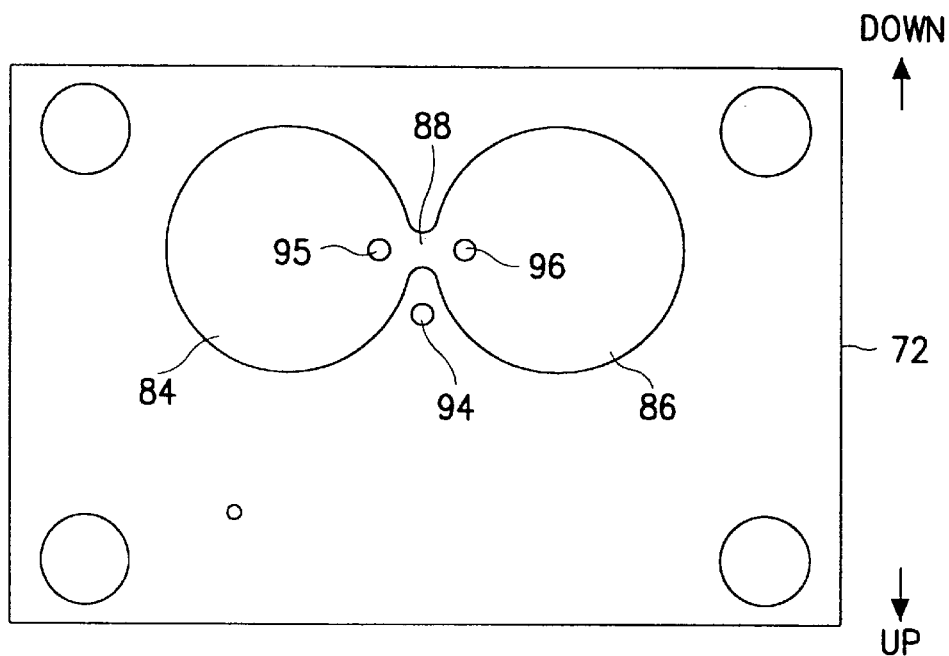

Referring to FIGS. 5A and 5B, Teflon is used to make the frequency converter, which has a conversion loss of 7.5 dB in the operating frequency range of 1.6 to 10.2 GHz and suppresses the image rejection over −17 dBc.

In operation, the unbalanced LO signals is supplied through the microstrip lines 80 and 82 to the two separate strip lines 76 and 78 to the holes 92 and 93 to the diodes D2 and D3 of the quad diode mixer bridge 98. Meanwhile, the balanced RF signal is supplied through the microstrip line 74 to the zero length slot line 88 to the bridge 98. The bridge converts the frequencies of the received signals into the IF signal, which in turn is sent through the same path as the input path of the IF and LO signals. The converted frequencies may have a broad band because of the open end circuits of the ring resonators connected to both ends of the slot line 88. In addition, the RF signal is supplied through the microstrip line 74 and the holes 91 and 94 directly to the quad diode 98, achieving a good impedance matching in the broad frequency band.

While the present invention has been described with reference to the specific embodiment accompanying the attached drawings, it will be readily appreciated that various modifications and changed may be made without departing from the gist of the present invention.

What is claimed is:

1. A frequency converter apparatus, comprising:
   a quad diode mixer bridge including a plurality of diodes, said mixer bridge having first, second, and third terminals, each of said three terminals being coupled to at least one of said diodes;

a first panel, comprising:
  a first microstrip line receiving radio frequency signals;
  a first strip line being positioned at a first side of said first microstrip line, said first strip line being formed in a shape of a ring;
  a second strip line being positioned at a second side of said first microstrip line opposite to said first side of said first microstrip line, said second strip line being formed in a shape of a ring;
  a second microstrip line being connected to an outer portion of said first strip line;
  a third microstrip line being connected to an outer portion of said second strip line, said second and third microstrip lines receiving local oscillation signals and conveying the local oscillation signals respectively to said first and second strip lines; and
  said first microstrip line being located between said first and second ring-shaped strip lines, said first microstrip line being formed in a shape of one straight line with no lines branching from said first microstrip line;

a second panel distinct from said first panel, comprising;
  a slot line being arranged to be perpendicular to said first microstrip line, said slot line having a first end and a second end, said slot line being formed in a general shape of one straight line with no straight lines branching from said slot line;
  a first ring-type resonator being connected to said first end of said slot line; and
  a second ring-type resonator being connected to said second end of said slot line, each of said first and second ring-type resonators having a respective internal portion removed to reduce power dispersion;

said first terminal of said mixer bridge being received by an orifice formed in said first microstrip line of said first panel and by an orifice formed in said second panel, said second terminal of said mixer bridge being received by an orifice formed in said first strip line of said first panel and by an orifice formed in said first ring-type resonator of said second panel, said third terminal of said mixer bridge being received by an orifice formed in said second strip line of said first panel and by an orifice formed in said second ring-type resonator of said second panel, said mixer bridge generating intermediate frequency signals from the radio frequency signals and the local oscillation signals; and a balun unit being formed by said slot line aligned with said first microstrip line in a parallel T-junction.

2. The converter of claim 1, said second and third microstrip lines conveying the intermediate frequency signals from said mixer bridge.

3. The converter of claim 2, said mixer bridge generating the intermediate frequency signals by means of a frequency difference between the radio frequency signals and the local oscillation signals.

4. An apparatus, comprising:
  an upper ground panel;
  a first microstrip line receiving radio frequency signals;
  first and second strip lines respectively disposed on either side of said first microstrip line;
  second and third microstrip lines respectively connected to outer ends of said first and second strip lines to provide signal paths inputting local oscillation signals and outputting intermediate frequency signals;
  said first, second, and third microstrip lines, and said first and second strip lines each being constructed of a dielectric material and each being disposed on said upper ground panel;
  a lower dielectric layer;
  a slot line connected in a parallel T-junction with said first microstrip line receiving the radio frequency signals;
  first and second open end circuits respectively connected to both ends of said slot line;
  said slot line, and said first and second open end circuits being disposed on said lower dielectric layer; and
  a quad diode mixer bridge having a pair of diode connection points connected to said slot line and having another pair of diode connection points respectively connected to said second and third microstrip lines, the radio frequency signals and local oscillation signals being converted into corresponding intermediate frequency signals by said mixer bridge.

5. The apparatus of claim 4, said first and second open end circuits comprising ring-type resonators.

6. The apparatus of claim 5, said ring-type resonators each having an internal portion thereof removed.

7. The converter of claim 1, said balun unit corresponding to a balanced to unbalanced line converter.

8. The converter of claim 1, said first panel corresponding to a ground panel.

9. The converter of claim 1, said second panel corresponding to a dielectric layer.

10. The converter of claim 1, the radio frequency signals being supplied through said first microstrip line and through the orifice formed in said first microstrip line and through the orifice formed in said second panel directly to said mixer bridge, to achieve a good impedance matching in a broad frequency band.

11. The converter of claim 1, said first, second, and third microstrip lines, and said first and second strip lines being formed from a dielectric layer.

12. The converter of claim 1, said first microstrip line being arranged in a center of said first panel.

13. The converter of claim 1, said first and second strip lines being spaced apart from said first microstrip line.

14. The converter of claim 1, the orifices being formed in said converter to connect said mixer bridge to said microstrip lines, said strip lines, and said ring-type resonators.

15. The converter of claim 1, further comprising:
  a first capacitor having a first terminal and a second terminal, said second terminal being coupled to said second microstrip line;
  a first inductor having a first terminal and a second terminal, said second terminal being connected to said second microstrip line;
  said first terminal of said first capacitor receiving the local oscillation signals; and
  said first terminal of said first inductor outputting the intermediate frequency signals from said mixer bridge.

16. The converter of claim 1, said first strip line being concentrically aligned with said first ring-type resonator.

17. The apparatus of claim 4, further comprising:
  a first capacitor having a first terminal and a second terminal, said second terminal being coupled to said second microstrip line;
  a first inductor having a first terminal and a second terminal, said second terminal being connected to said second microstrip line;
  said first terminal of said first capacitor receiving the local oscillation signals; and said first terminal of said first inductor outputting the intermediate frequency signals from said mixer bridge.

18. An apparatus, comprising:

a first microstrip line receiving radio frequency signals;

a first strip line being positioned at a first side of said first microstrip line, said first strip line being formed in a shape of a ring;

a second strip line being positioned at a second side of said first microstrip line opposite to said first side of said first microstrip line, said second strip line being formed in a shape of a ring;

a second microstrip line being connected to an outer portion of said first strip line; and a third microstrip line being connected to an outer portion of said second strip line, said second and third microstrip lines receiving local oscillation signals and conveying the local oscillation signals respectively to said first and second strip lines;

a slot line being arranged to be perpendicular to said first microstrip line, said slot line having a first end and a second end;

a first ring-type resonator being connected to said first end of said slot line; and a second ring-type resonator being connected to said second end of said slot line, each of said first and second ring-type resonators having a respective internal portion removed to reduce power dispersion;

a quad diode mixer bridge including a plurality of diodes, being coupled to said microstrip lines, said strip lines, and said ring-type resonators, generating intermediate frequency signals from the received radio frequency signals and the received local oscillation signals.

19. The converter of claim 18, said second and third microstrip lines conveying the intermediate frequency signals from said mixer bridge.

20. The converter of claim 19, said mixer bridge generating the intermediate frequency signals by means of a frequency difference between the radio frequency signals and the local oscillation signals.

21. The converter of claim 19, further comprising a balun unit being formed by said slot line aligned with said first microstrip line in a parallel T-junction.

22. The converter of claim 21, said balun unit corresponding to a balanced to unbalanced line converter.

23. The converter of claim 19, the radio frequency signals being supplied through said first microstrip line and through an orifice formed in said first microstrip line and through an orifice formed in said second panel directly to said mixer bridge, to achieve a good impedance matching in a broad frequency band.

24. The converter of claim 19, said first, second, and third microstrip lines, and said first and second strip lines being formed from a dielectric layer.

25. The converter of claim 19, said first microstrip line being arranged in a center of said first panel.

26. The converter of claim 25, said first and second strip lines being spaced apart from said first microstrip line.

27. The converter of claim 26, further comprising:

a first capacitor having a first terminal and a second terminal, said second terminal being coupled to said second microstrip line;

a first inductor having a first terminal and a second terminal, said second terminal being connected to said second microstrip line;

said first terminal of said first capacitor receiving the local oscillation signals; and said first terminal of said first inductor outputting the intermediate frequency signals from said mixer bridge.

28. The converter of claim 27, said first strip line being concentrically aligned with said first ring-type resonator.

29. The converter of claim 28, further comprising:

a second capacitor having a first terminal and a second terminal, said second terminal being coupled to said third microstrip line;

a second inductor having a first terminal and a second terminal, said second terminal being connected to said third microstrip line;

said first terminal of said second capacitor receiving the local oscillation signals; and said first terminal of said second inductor outputting the intermediate frequency signals from said mixer bridge.

30. The converter of claim 29, said second strip line being concentrically aligned with said second ring-type resonator.

* * * * *